United States Patent
Kanda (10) Patent No.: US 10,396,973 B2
(45) Date of Patent: Aug. 27, 2019

(54) CLOCK REGENERATION CIRCUIT, SEMICONDUCTOR INTEGRATED CIRCUIT DEVICE AND RF TAG

(71) Applicant: FUJITSU LIMITED, Kawasaki-shi, Kanagawa (JP)

(72) Inventor: Kouichi Kanda, Chofu (JP)

(73) Assignee: FUJITSU LIMITED, Kawasaki (JP)

( * ) Notice: Subject to any disclaimer, the term of this patent is extended or adjusted under 35 U.S.C. 154(b) by 57 days.

(21) Appl. No.: 15/694,017

(22) Filed: Sep. 1, 2017

(65) Prior Publication Data

US 2018/0076950 A1    Mar. 15, 2018

(30) Foreign Application Priority Data

Sep. 9, 2016   (JP) ................. 2016-177100

(51) Int. Cl.
| | |
|---|---|
| *H04L 7/033* | (2006.01) |
| *G06K 19/077* | (2006.01) |
| *H03L 7/08* | (2006.01) |
| *H03L 7/099* | (2006.01) |
| *H04B 1/16* | (2006.01) |
| *H04L 7/04* | (2006.01) |
| *H04W 52/00* | (2009.01) |

(52) U.S. Cl.
CPC ...... *H04L 7/0331* (2013.01); *G06K 19/07773* (2013.01); *H03L 7/0807* (2013.01); *H03L 7/0995* (2013.01); *H04B 1/16* (2013.01); *H04L 7/046* (2013.01); *H04W 52/00* (2013.01)

(58) Field of Classification Search
CPC ..... H04L 7/0331; H04L 7/046; H03L 7/0807; H03L 7/0995; H04B 1/16; G06K 19/07773; H04W 52/00

USPC .......................................................... 375/355
See application file for complete search history.

(56) References Cited

U.S. PATENT DOCUMENTS

| | | | | |
|---|---|---|---|---|
| 5,596,582 A | * | 1/1997 | Sato ................. | H04L 27/2657 370/203 |
| 2007/0069865 A1 | * | 3/2007 | Akiyama ......... | G06K 19/07749 340/10.2 |
| 2007/0082647 A1 | * | 4/2007 | Behzad ............. | H04W 52/0229 455/343.1 |
| 2013/0039450 A1 | * | 2/2013 | Huang .............. | H04L 7/0331 375/343 |

FOREIGN PATENT DOCUMENTS

| | | |
|---|---|---|
| JP | 7-273646 | 10/1995 |
| JP | 8-107351 | 4/1996 |
| JP | 2011-40803 | 2/2011 |

OTHER PUBLICATIONS

S. Masui, et al., "A 13.56MHz CMOS RF Identification Transponder Integrated Circuit With a Dedicated CPU," ISSCC 9.1, 8 pages, Feb. 1999.

(Continued)

*Primary Examiner* — Michael R Neff
(74) *Attorney, Agent, or Firm* — Staas & Halsey LLP (57) ABSTRACT

A clock regeneration circuit includes a pattern detection circuit that detects a pattern having a time interval determined in advance in an input signal, and a signal processing circuit that generates a clock by variably controlling a time interval for oscillation based on the time interval of the detected pattern.

13 Claims, 12 Drawing Sheets

(56) References Cited

OTHER PUBLICATIONS

K. Myny, et al., "Bidirectional Communication in an HF Hybrid Organic/Solution-Processed Metal-Oxide RFID Tag," ISSCC 18.3, 3 pages, Feb. 2012.
V. Fiore, et al., "A 13.56MHz RFID Tag with Active Envelope Detection in an Organic Complementary TFT Technology," ISSCC Dig. Tech. Papers, 3 pages, Feb. 2014.

\* cited by examiner

310(NOR i3)

CLOCK REGENERATION CIRCUIT, SEMICONDUCTOR INTEGRATED CIRCUIT DEVICE AND RF TAG

CROSS-REFERENCE TO RELATED APPLICATION

This application is based upon and claims the benefit of priority of the prior Japanese Patent Application No. 2016-177100, filed on Sep. 9, 2016, the entire contents of which are incorporated herein by reference.

FIELD

The embodiment discussed herein is related to a clock regeneration circuit, a semiconductor integrated circuit device, and a RF tag.

BACKGROUND

In recent years, an organic semiconductor field effect transistor (organic semiconductor FET) that operates with low power consumption has been researched and developed, and, for example, radio frequency identification (RFID) is noticed as a target of application of the organic semiconductor field effect transistor. Here, the RFID is technology for reading and writing data of a RF tag in a non-contact manner using radio waves, and for the RFID (RF tag), an operating speed of approximately 20 to 100 kb/second is demanded by standards such as ISO 14443 and ISO 15693.

Incidentally, for example, a RF tag to which a silicon semiconductor is applied receives and divides a signal of 13.56 MHz sent from a reader (reader-and-writer) and regenerates (generates) a clock of a given frequency. For example, according to ISO 15693, a carrier of 13.56 MHz from a reader is subjected to $1/512$ division to generate a clock of 26 KHz while, according to ISO 14443, a carrier of 13.56 MHz is subjected to $1/128$ division to generate a clock of 106 KHz. Each of the clocks of 26 KHz and 106 KHz is used as a clock of a symbol rate.

However, in a RF tag to which an organic semiconductor is applied, the operating frequency of an oscillator is on the order of 100 KHz, and it is difficult to generate a clock of a symbol rate by dividing the carrier of 13.56 MHz from a reader.

Incidentally, various proposals have been made for a clock regeneration circuit (clock data recovery circuit (CDR circuit)) for regenerating a clock of a symbol rate from a received signal (data).

As described hereinabove, it is difficult, for example, for a RF tag to which an organic semiconductor is applied to generate a clock of a symbol rate by dividing a signal sent from a reader like a RF tag to which a silicon semiconductor is applied.

Further, in a clock regeneration circuit (CDR), a clock is generated usually based on a phase locked loop (PLL). In this case, a voltage controlled oscillator (VCO) is used. However, since the dispersion is great with an organic semiconductor, there is the possibility that a generated (regenerated) clock may not be locked to a desired frequency.

It is to be noted that a clock regeneration circuit, a semiconductor integrated circuit device, and a RF tag according to the embodiment discussed herein are not limited to those to which an organic semiconductor is applied but may be those to which various semiconductors including a silicon semiconductor and a compound semiconductor are applied.

The followings are reference documents.
[Document 1] Japanese Laid-open Patent Publication No. 2011-040803,
[Document 2] Japanese Laid-open Patent Publication No. 07-273646,
[Document 3] Japanese Laid-open Patent Publication No. 08-107351,
[Document 4] S. Masui et al., "A 13.56 MHz CMOS RF Identification Transponder Integrated Circuit With A Dedicated CPU," ISSCC 9.1, February 1999,
[Document 5] K. Myny et al., "Bidirectional Communication in an HF Hybrid Organic/Solution-Processed Metal-Oxide RFID Tag," ISSCC 18.3, February 2012, and
[Document 6] V. Fiore et al., "A 13.56 MHz RFID Tag with Active Envelope Detection in an Organic Complementary TFT Technology," ISSCC Dig. Tech. Papers, pp. 492-494, February 2014.

SUMMARY

According to an aspect of the embodiment, a clock regeneration circuit includes a pattern detection circuit that detects a pattern having a time interval determined in advance in an input signal, and a signal processing circuit that generates a clock by variably controlling a time interval for oscillation based on the time interval of the detected pattern.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
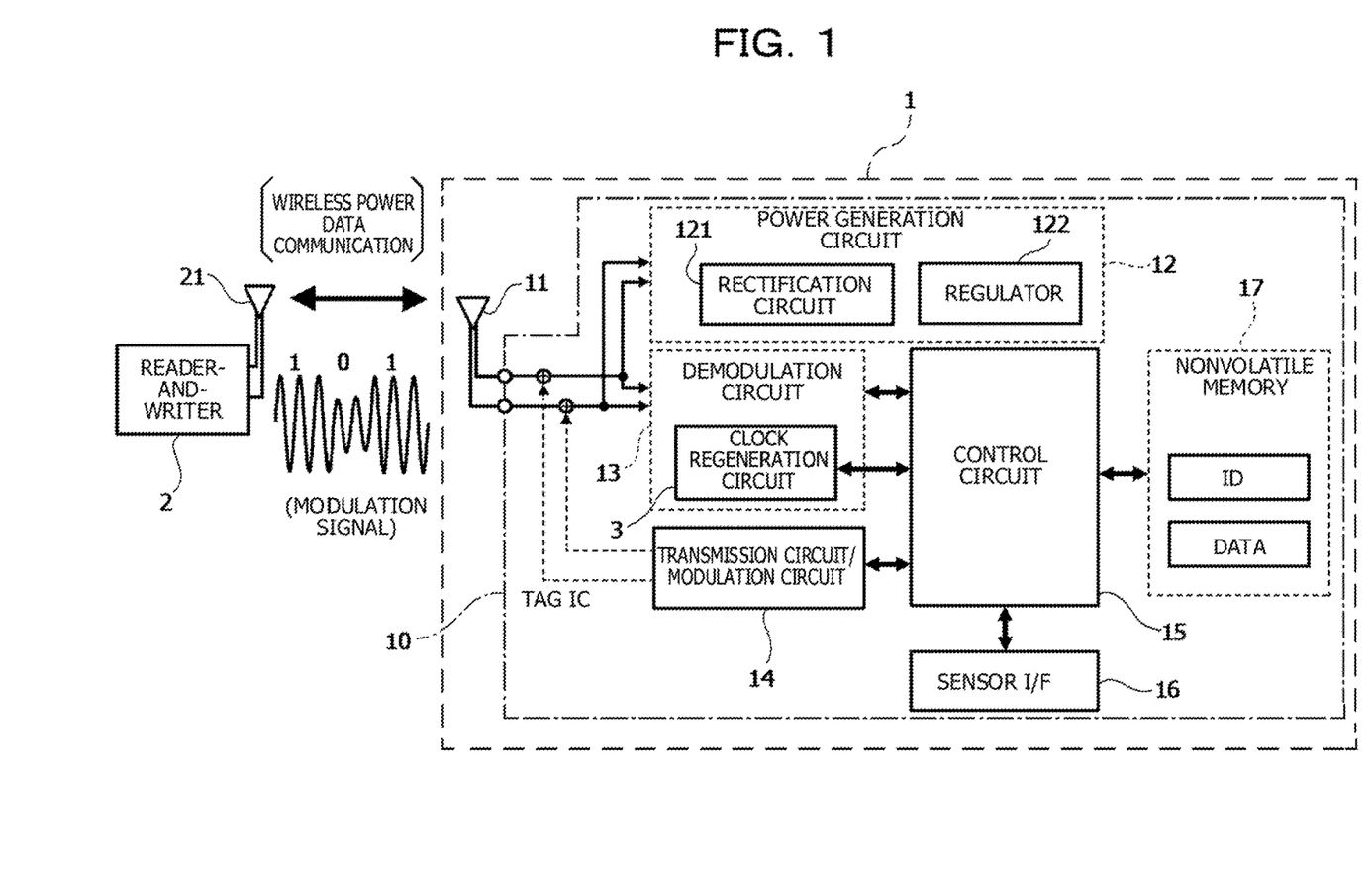
FIG. 1 is a block diagram roughly depicting RFID as an example to which the embodiment discussed herein is applied.

In the following, a working example of a clock regeneration circuit, a semiconductor integrated circuit device and a RF tag is described with reference to the accompanying drawings. FIG. 1 is a block diagram roughly depicting RFID (RFID system) as an example to which the embodiment discussed herein is applied.

As depicted in FIG. 1, the RFID system includes a RF tag 1 and a reader-and-writer (reader) 2, and the RF tag 1 includes a tag IC (semiconductor integrated circuit device) 10 and an antenna 11. The tag IC 10 wirelessly receives power, for example, from the reader 2 and performs transfer of data to and from the reader (reader-and-writer) 2 through the antenna 11 provided on the RF tag 1 and an antenna 21 provided on the reader 2.

The tag IC 10 includes, for example, a power generation circuit 12, a demodulation circuit 13, a transmission circuit/modulation circuit 14, a control circuit 15, a sensor interface (sensor I/F) 16 and a nonvolatile memory 17. The power generation circuit 12 includes a rectification circuit 121 and a regulator 122, and generates power from a signal of the reader 2 (antenna 21) received, for example, through the antenna 11 and supplies the power to each circuit of the tag IC 10.

The demodulation circuit 13 includes a clock regeneration circuit (CDR circuit) 3, and generates a clock based on a signal of the reader 2 received through the antenna 11 and performs demodulation of data and so forth using the generated clock. It is to be noted that naturally the clock regeneration circuit of the present embodiment is not limited to that provided in the demodulation circuit 13 of the tag IC 10 in the RFID system depicted in FIG. 1.

The transmission circuit/modulation circuit 14 is a circuit for modulating data from the RF tag 1 (tag IC 10) and transmitting the data from the antenna 11. Data and an identification (ID) to be transmitted from the RF tag 1 are stored in the nonvolatile memory 17 such as a flash electrically erasable programmable read-only memory (EEPROM). Meanwhile, the sensor I/F 16 is for receiving data from a sensor such as a temperature sensor and receives data from various sensors in accordance with a use of the RFID system.

The control circuit 15 controls, for example, the demodulation circuit 13, the transmission circuit/modulation circuit 14, the sensor I/F 16, the nonvolatile memory 17 and so forth to perform control demanded for the RFID system and transfers data to and from the reader 2 through the antenna 11 (21). It is to be noted that the clock used by the control circuit 15, the transmission circuit/modulation circuit 14, the sensor I/F 16, the nonvolatile memory 17 and so forth is generated by the clock regeneration circuit 3 provided in the demodulation circuit 13 as described above.

Figure 2:
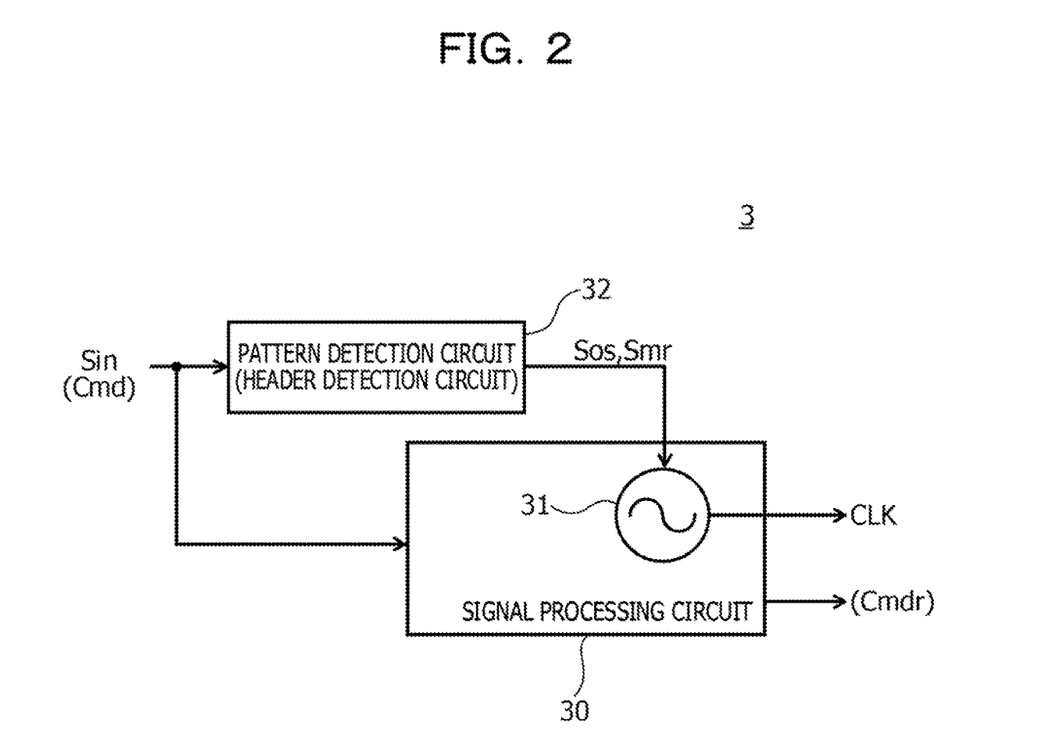
FIG. 2 is a block diagram schematically depicting an example of a clock regeneration circuit of the present embodiment.

FIG. 2 is a block diagram schematically depicting an example of a clock regeneration circuit of the present embodiment. As depicted in FIG. 2, the example of the clock regeneration circuit of the present embodiment includes a pattern detection circuit (header detection circuit) 32 and a signal processing circuit 30. The pattern detection circuit 32 detects a pattern having a time interval determined in advance in an input signal Sin (inputted command signal Cmd) as hereinafter described in detail.

The signal processing circuit 30 variably controls the time interval for oscillation based on the time interval of the pattern detected by the pattern detection circuit 32 to generate a clock CLK and outputs the clock CLK to the transmission circuit/modulation circuit 14, the control circuit 15, the sensor I/F 16 and the nonvolatile memory 17 described above. Further, the signal processing circuit 30 receives a command signal Cmd, retimes the command signal Cmd based on the clock CLK to generate a command signal Cmdr and outputs the command signal Cmdr to the control circuit 15 and so forth.

Here, although the time interval of a pattern to be detected by the pattern detection circuit 32 may be, for example, a pattern in the header part of the command signal Cmd from the reader 2 in FIG. 1, if the time interval is prescribed in advance, the time interval may not be the pattern in the header part of the command signal Cmd. For example, a user may incorporate a pattern having a time interval determined in advance into a given position of the command signal Cmd such that the incorporated pattern may be detected by the pattern detection circuit 32.

Further, the pattern having the time interval determined in advance is not limited to the command signal Cmd to be inputted, and also it is possible to incorporate a given pattern, for example, into a data area open to a user such that the given pattern is detected by the pattern detection circuit 32. Further, it is a matter of course that the clock regeneration circuit (CDR circuit) of the present embodiment is not limited, for example, to that applied to the tag IC 10 of the RF tag 1 in the RFID system.

Figure 3:
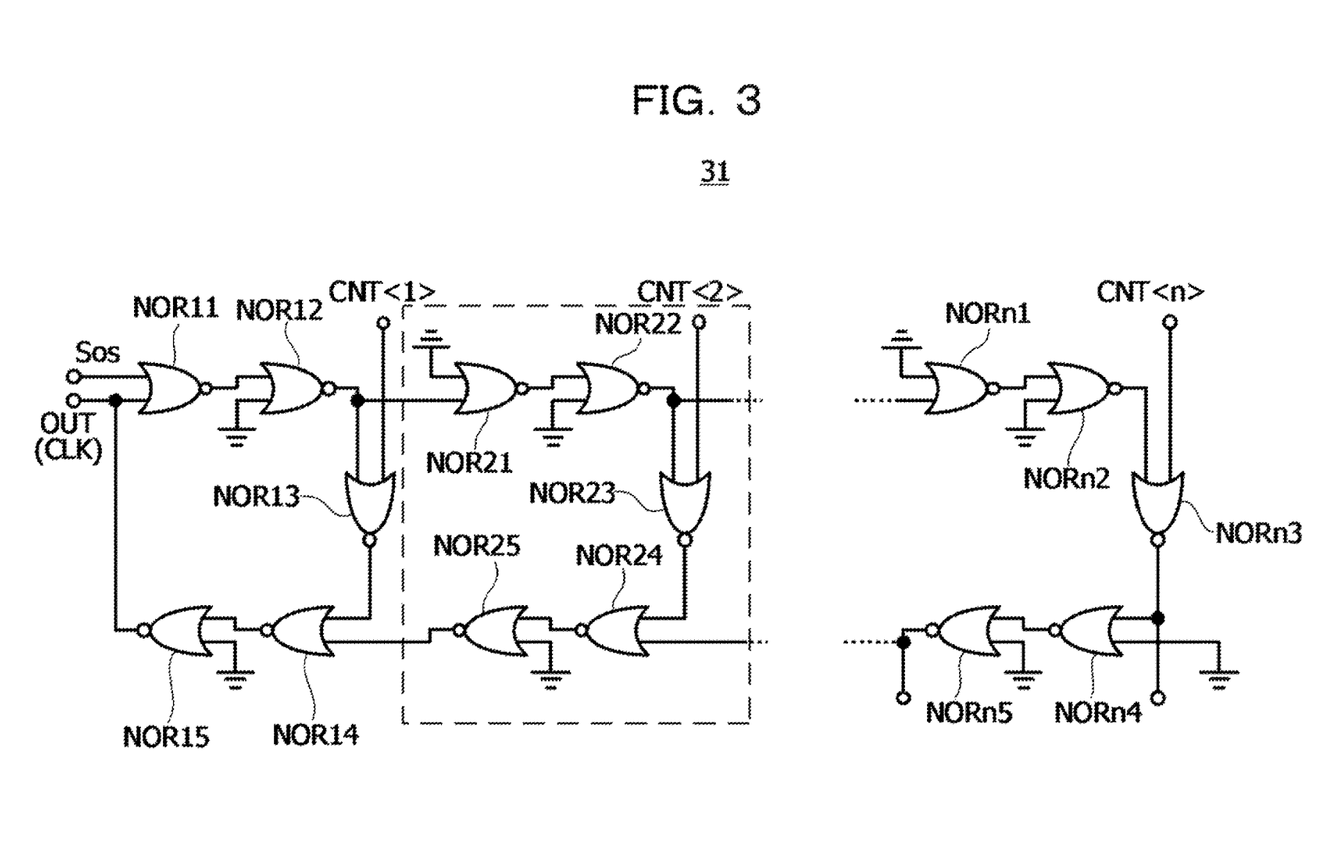
FIG. 3 is a circuit diagram depicting a main part of an example of a variable clock generation circuit in the clock regeneration circuit depicted in FIG. 2.

FIG. 3 is a circuit diagram depicting a main part of an example of a variable clock generation circuit in the clock regeneration circuit depicted in FIG. 2. The variable clock generation circuit is formed as a variable stage number ring oscillator. The variable clock generation circuit depicted in FIG. 3 may be the variable clock generation circuit 31 depicted in FIG. 2.

As depicted in FIG. 3, the variable stage number ring oscillator includes, for example, n stages of oscillator units, each of which includes five NOR gates. For example, the oscillator unit at the first stage includes NOR gates NOR11 to NOR15; the oscillator unit at the second stage includes NOR gates NOR21 to NOR25; and the oscillator unit at the nth stage includes NOR gates NORn1 to NORn5. It is to be noted that, in the oscillator unit at the first stage, an oscillation starting signal Sos is inputted to one of inputs of the NOR gate NOR11, and an output of the NOR gate NOR15 is inputted to the other input of the NOR gate NOR11. Further, the output of the NOR gate NOR15 is outputted (OUT) as a clock CLK generated by the variable stage number ring oscillator (variable clock generation circuit) 31.

Here, the oscillation frequency of the clock CLK is controlled by the return NOR gates NOR13, NOR23, ..., and NORn3. For example, when only a selection signal CNT<1> to one of inputs of the NOR gate NOR13 has the low level "L," an output of the NOR gate NOR13 is a result of logic inversion of an output of the NOR gate NOR12, and when the selection signal CNT<1> has the high level "H," the output of the NOR gate NOR13 is fixed to "L" independently of the output of the NOR gate NOR12. Accordingly, if the selection signal CNT<1> is selected ("L"), a ring oscillator including the five NOR gates (inversion logic elements) NOR11 to NOR15 is formed.

On the other hand, for example, when only a selection signal CNT<2> to one of inputs of the NOR gate NOR23 has the low level "L," an output of the NOR gate NOR23 is a result of logic inversion of an output of the NOR gate NOR22, and when the selection signal CNT<2> has the high level "H," the output of the NOR gate NOR23 is fixed to "L" independently of the output of the NOR gate NOR22. Accordingly, if the selection signal CNT<2> is selected ("L"), a ring oscillator including the nine NOR gates NOR11, NOR12, NOR21 to NOR25, NOR14 and NOR15 is formed. It is to be noted that, when only a selection signal CNT<n> to one of inputs of the NOR gate NORn3 has the low level "L," a ring oscillator including (n×2+1) NOR gates is formed. In this manner, the variable clock generation circuit 31 may be formed as a variable stage number ring oscillator.

Figure 4A:
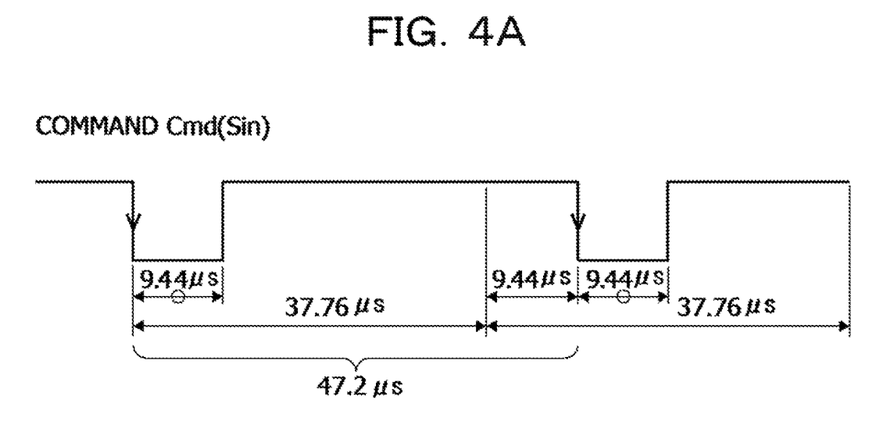
FIGS. 4A and 4B are views illustrating examples of a command signal utilized by the clock regeneration circuit depicted in FIG. 2.
Figure 4B:
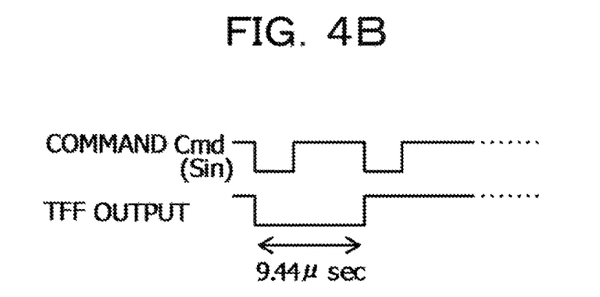

FIGS. 4A and 4B are views illustrating examples of a command signal utilized by the clock regeneration circuit depicted in FIG. 2, wherein FIG. 4A depicts a configuration of the header part of a command signal according to ISO 15693, and FIG. 4B depicts a configuration of the header part of a command signal according to ISO 14443 type A.

First, as depicted in FIG. 4A, for example, a pattern transiting in level like "H"→"L"→"H" is provided at the top of the header part (start of frame (SOF)) of a command signal Cmd (input signal Sin) according to ISO 15693, and the period of "L" is prescribed as 9.44 microseconds. In the clock regeneration circuit of the present embodiment, the pattern having this time interval determined in advance is detected, and a clock CLK may be generated by variably controlling the time interval for oscillation based on the time interval of the detected pattern. It is to be noted that the clock cycle of the symbol rate in ISO 15693 is 18.88 microseconds.

Here, in the variable control of the oscillation frequency of the clock CLK, the transition of "H"→"L"→"H" whose time interval is determined in advance is detected by a plural number of times, for example, at the header part of a command signal Cmd, and frequency control of the clock CLK is repeated by a plural number of times such that the frequency gradually approaches the detected time interval. It is to be noted that, in ISO 15693, not the "L" period (9.44 microseconds) of the transition "H"→"L"→"H" described above, but, for example, a period (47.2 microseconds) after the fall of "H"→"L" at the top of the header part till a next fall of "H"→"L" may be utilized. Furthermore, the pattern to be utilized is not limited to the pattern in the header part of the command signal Cmd, and a pattern having a time interval determined in advance in the input signal Sin may be utilized. Also it is possible for a user to define a pattern having a time interval determined in advance using an area allocated to the user.

Meanwhile, as depicted in FIG. 4B, in the header part of the command signal Cmd (Sin) according to ISO 14443 type A, the top of a command signal, for example, in an initial state is "00," and if the signal at this portion is inputted to a trigger flip-flop (TFF), an output whose "L" period is 9.44 microseconds is obtained. For example, the command signal Cmd transits (varies in level) like "H"→"L"→"H," and an "L" period of 9.44 microseconds is obtained as an output of the TFF.

The clock regeneration circuit of the present embodiment may detect a pattern having the time interval determined in advance and variably control the time interval for oscillation based on the time interval of the detected pattern to generate a clock CLK. It is to be noted that the clock cycle of the symbol rate in ISO 14443 type A is 9.44 microseconds. Also in ISO 14443 type A, similarly as in ISO 15693 described above, it is needless to say that the pattern to be utilized is not limited to the pattern in the header part of the command signal Cmd, and a pattern having a time interval determined in advance in the input signal Sin may be utilized. Furthermore, this similarly applies also to other various standards.

Figure 5:
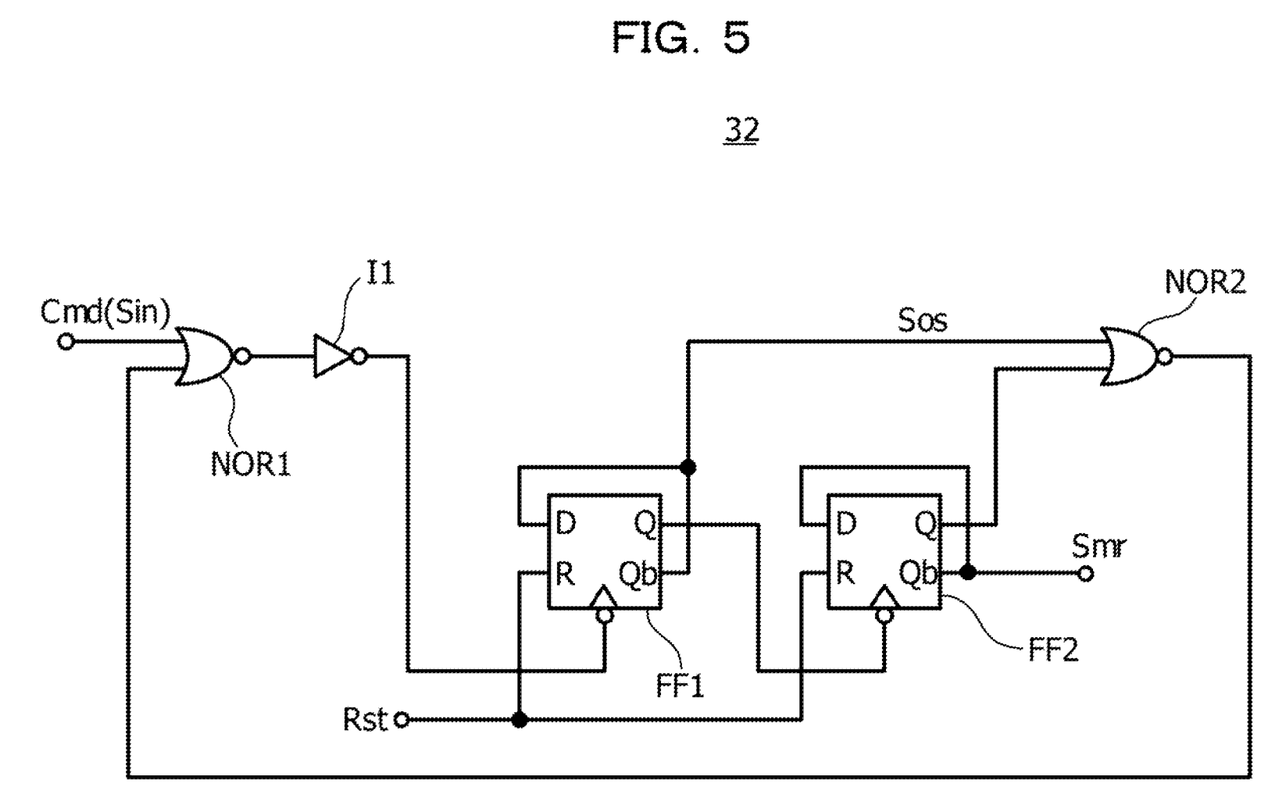
FIG. 5 is a circuit diagram depicting an example of a pattern detection circuit in the clock regeneration circuit depicted in FIG. 2.

FIG. 5 is a circuit diagram depicting an example of a pattern detection circuit in the clock regeneration circuit depicted in FIG. 2. The pattern detection circuit depicted in FIG. 5 may be the pattern detection circuit 32 depicted in FIG. 2. As depicted in FIG. 5, the pattern detection circuit (header detection circuit) 32 includes NOR gates NOR1 and NOR2, an inverter I1 and D-type flip-flops FF1 and FF2. Here, the reference character Cmd represents a command signal (input signal Sin), Sos an oscillation starting signal, Smr a mirror signal, and Rst a reset signal. It is to be noted that the reset signal Rst is a signal outputted, for example, when an electronic apparatus (semiconductor integrated circuit device 10) such as the RF tag 1 is power-on reset.

A command signal Cmd is inputted to one of inputs of the NOR gate NOR1, and an output signal of the NOR gate NOR2 is inputted to the other input of the NOR gate NOR1. An output of the NOR gate NOR1 is logically inverted by the inverter I1 and inputted to an inverted clock terminal of the D-type flip-flop FF1, and an output of the D-type flip-flop FF1 is inputted to an inverted clock terminal of the D-type flip-flop FF2. An output of a terminal Qb (logically inverted output of a terminal Q) of the D-type flip-flop FF1 is used as an oscillation starting signal Sos and is inputted to one of inputs of the NOR gate NOR2. It is to be noted that the Qb output terminal of the D-type flip-flop FF1 is coupled to a D terminal (data input terminal) of the D-type flip-flop FF1.

A Qb output of the D-type flip-flop FF2 is used as an mirror signal Smr, and the Qb output terminal of the D-type flip-flop FF2 is coupled to a D terminal of the D-type flip-flop FF2. It is to be noted that the reset (power-on reset) signal Rst is inputted to reset inputs of the D-type flip-flops FF1 and FF2.

Figure 6:
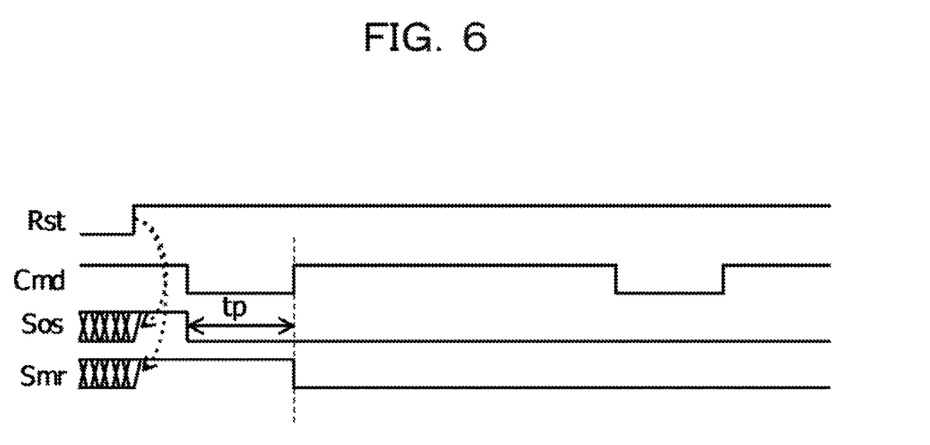
FIG. 6 is a timing chart illustrating action of the pattern detection circuit depicted in FIG. 5.

FIG. 6 is a timing chart illustrating action of the pattern detection circuit depicted in FIG. 5. As illustrated in FIG. 6, if the reset signal Rst rises from "L" to "H," the oscillation starting signal Sos falls from "H" to "L." Here, for example, if the command signal Cmd transits like "H"→"L"→"H," the mirror signal Smr falls from "H" to "L" based on a time interval (period of "L") tp determined in advance in the header part of the command signal Cmd. It is to be noted that the circuit depicted in FIG. 6 is a mere example and allows various modifications and alterations, and also the time interval determined in advance is not limited to the time interval in the header part of the input signal Sin (Cmd) as described above.

Figure 7:
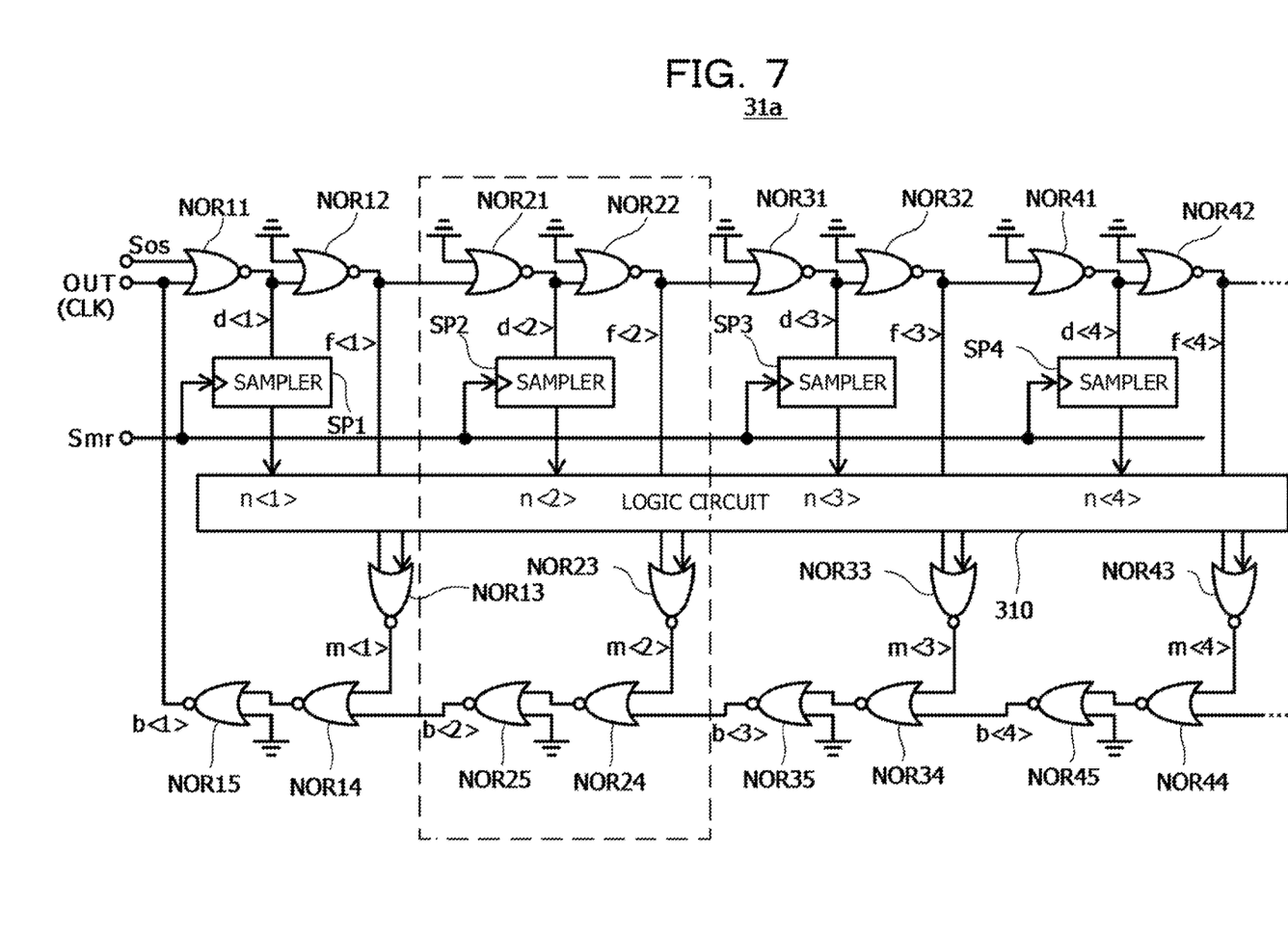
FIG. 7 is a circuit diagram depicting a first example of a variable clock generation circuit in the clock regeneration circuit depicted in FIG. 2.

FIG. 7 is a circuit diagram depicting a first example of a variable clock generation circuit in the clock regeneration circuit depicted in FIG. 2. As may be recognized from the comparison between FIG. 7 and FIG. 3 described hereinabove, in the first example, a configuration for controlling (selecting) the return NOR gates NOR13, NOR23, NOR33, . . . in the respective oscillator units that define a return stage number of the oscillator units is added.

For example, as depicted in FIG. 7, the variable clock generation circuit 31a of the first example includes a logic circuit 310 and samplers SP1, SP2, SP3, . . . provided in the respective oscillator units in addition to the variable clock generation circuit 31 depicted in FIG. 3. In the variable clock generation circuit 31a of the first example, control of the number of stages of the oscillator units, namely, selection of the return NOR gates NOR13, NOR23, NOR33, . . . , in the variable clock generation circuit 31 described hereinabove with reference to FIG. 3 is controlled using the mirror signal Smr.

Now, the logic circuit 310 (NOR gates NORi3: NOR13, NOR23, NOR33, . . . ) and the samplers SP (SP1, SP2, SP3, . . . ) are described with reference to FIGS. 8A, 8B, and 9. It is to be noted that, in FIG. 7, in the respective oscillator units, the outputs of the NOR gates NOR11, NOR21, NOR31, . . . are denoted by d<1>, d<2>, d<3>, . . . , and the outputs of the NOR gates NOR12, NOR22, NOR32, . . . are denoted by f<1>, f<2>, f<3>, . . . . Furthermore, in the respective oscillator units, the outputs of the samplers SP1, SP2, SP3, . . . are denoted by n<1>, n<2>, n<3>, . . . .

Figure 8A:
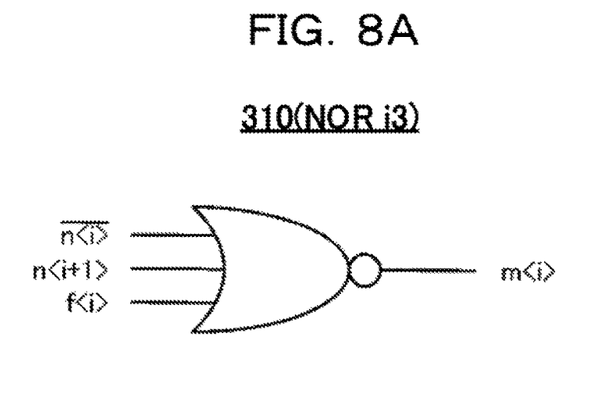
FIGS. 8A and 8B are views illustrating a logic circuit in the variable clock generation circuit depicted in FIG. 7.
Figure 8B:
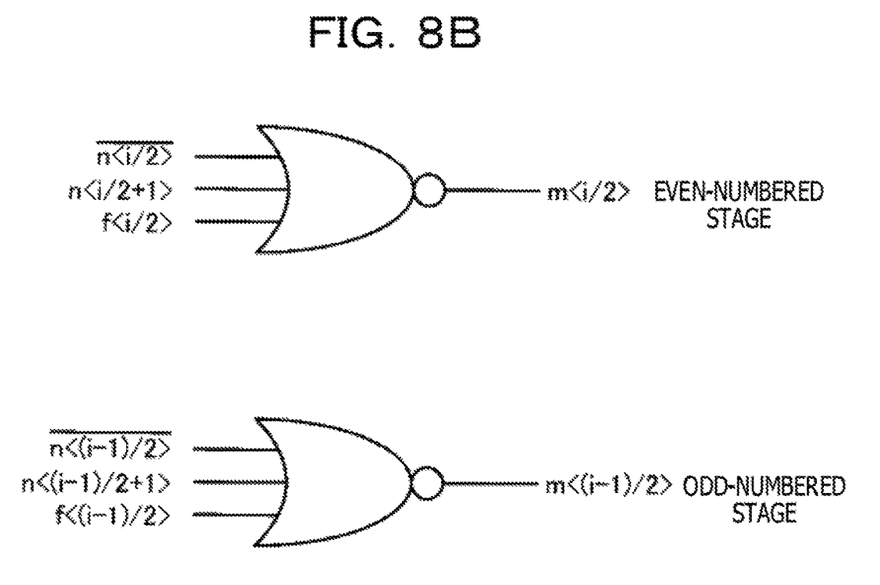
Figure 9:
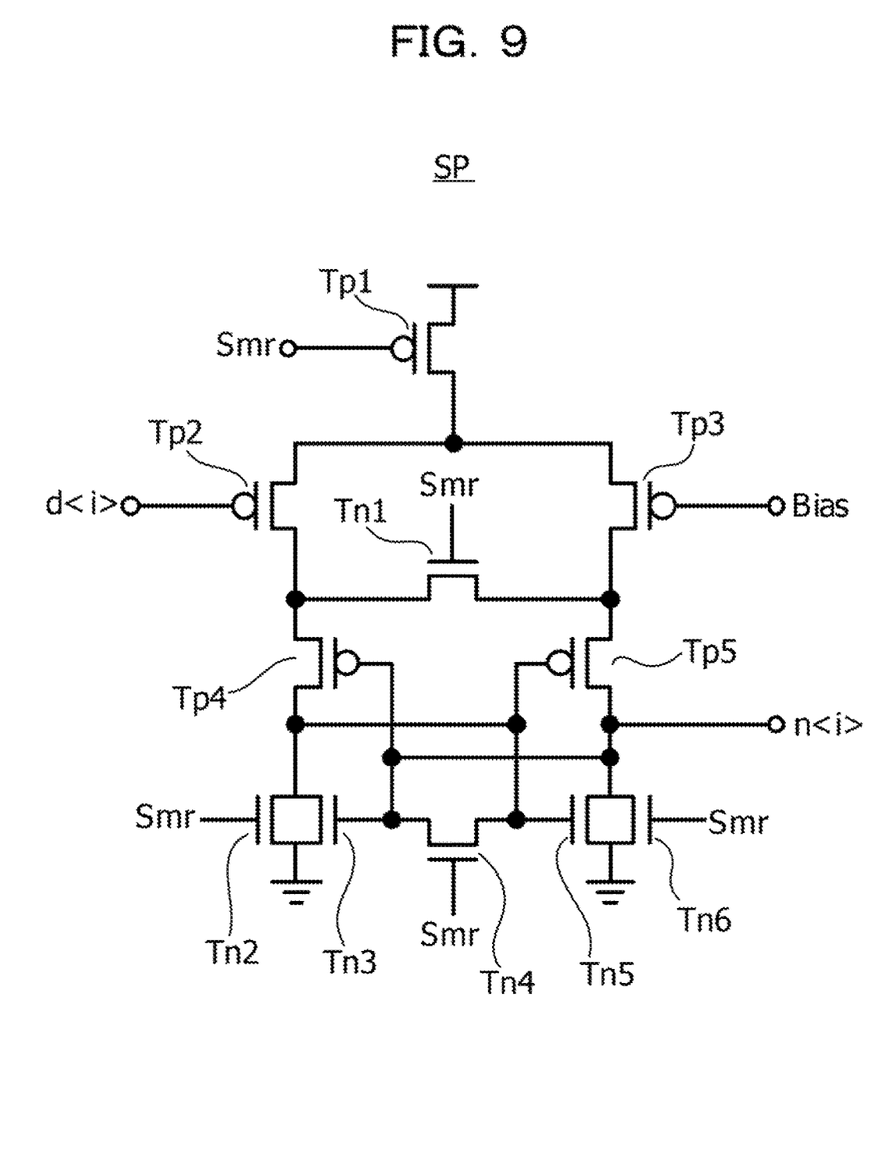
FIG. 9 is a circuit diagram depicting an example of samplers in the variable clock generation circuit depicted in FIG. 7.
Figure 10:
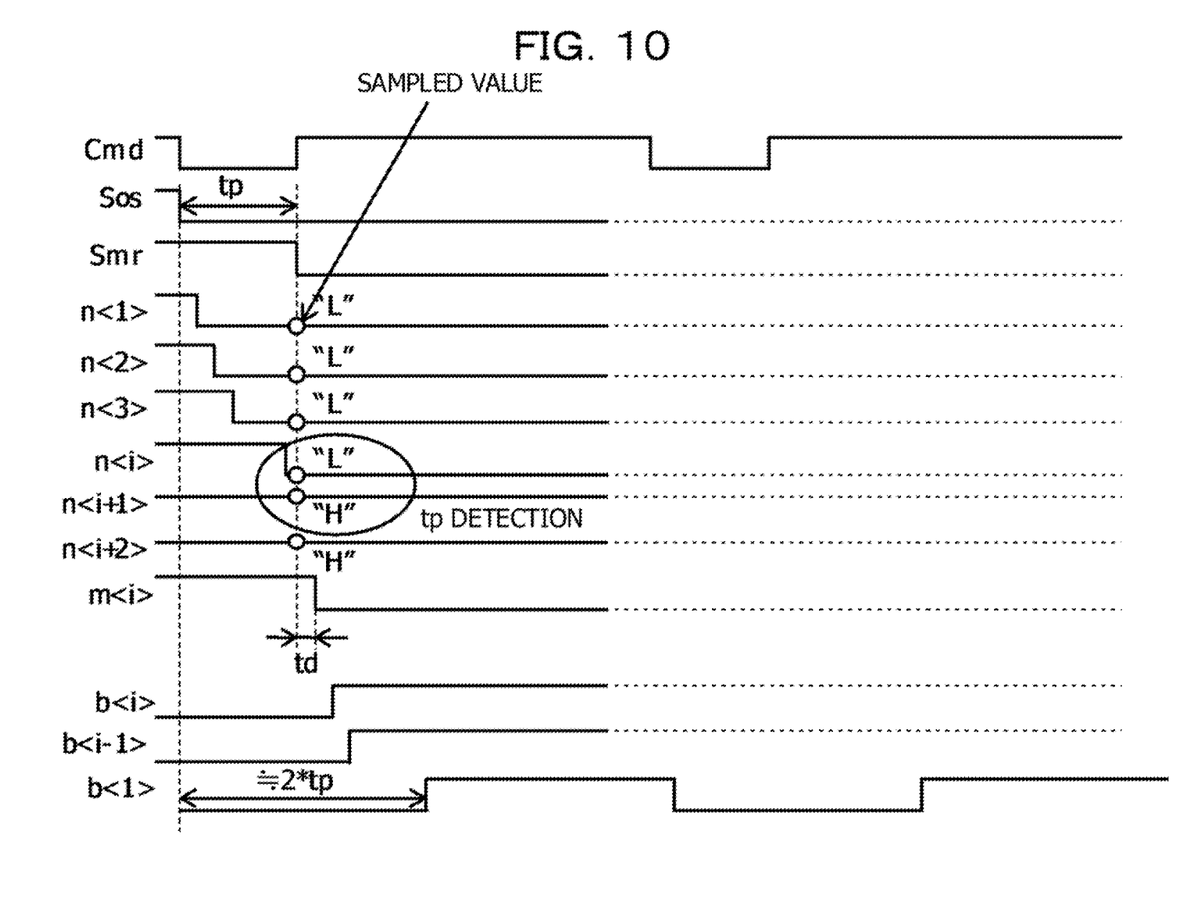
FIG. 10 is a timing chart illustrating action of the variable clock generation circuit depicted in FIG. 7.

FIGS. 8A and 8B are views illustrating a logic circuit (and NOR gates) in the variable clock generation circuit illustrated in FIG. 7. FIG. 9 is a circuit diagram depicting an example of samplers in the variable clock generation circuit depicted in FIG. 7. Further, FIG. 10 is a timing chart illustrating action of the variable clock generation circuit depicted in FIG. 7. The variable clock generation circuit, the logic circuit (NOR gates), and the sampler described with reference to FIGS. 8A to 10 may be the variable clock generation circuit 31a, the logic circuit 310 (NOR gates NORi3: NOR13, NOR23, NOR33, . . . ), and the sampler SP depicted in FIG. 7.

Here, the logic circuit 310 (and the NOR gates NORi3: NOR13, NOR23, NOR33, . . . ) and the samplers SP correspond to a selection circuit for selecting an output of an inversion logic element at a given stage in a ring oscillator. It is to be noted that, in the description of FIGS. 8A, 8B, and 9, an arbitrary stage number in the oscillator units at the first to nth stages is denoted by i. At this time, for example, when an output of a sampler SPi in an oscillator unit at the ith stage is "L" and an output of a sampler in an oscillator unit at the (i+1)th stage is "H," tp≈delay corresponding to the ith stage.

FIG. 8A illustrates a case in which the variable clock generation circuit (ring oscillator) 31a is locked so as to satisfy the cycle time period≈4×tp, and FIG. 8B illustrates another case in which the variable clock generation circuit 31a is locked so as to satisfy the cycle time period≈2×tp. It is to be noted that, in FIGS. 8A and 8B, signals processed by the logic circuit 310 and inputted to the respective return NOR gates NORi3 and signals outputted from the respective NOR gates NORi3 are illustrated.

First, as illustrated in FIG. 8A, when the variable clock generation circuit 31a is locked so as to satisfy the cycle time period≈4×tp, n<i>b (logically inverted signal of n<i>), n<i+1> and f<i> are inputted to the 3-input NOR gate NORi3, and an output signal m<i> is outputted.

On the other hand, as illustrated in FIG. 8B, when the variable clock generation circuit 31a is locked so as to satisfy the cycle time period≈2×tp, at each even-numbered stage, n<i/2>b, n<i/2+1> and f<i/2> are inputted to the 3-input NOR gate NORi3, and an output signal m<i/2> is outputted. Meanwhile, at each odd-numbered stage, n<(i−1)/2>b, n<(i−1)/2+1> and f<(i−1)/2> are inputted to the 3-input NOR gate NORi3, and an output signal m<(i−1)/2> is outputted. It is to be noted that, although, in FIG. 8B, i is an integer equal to or greater than 2, it is needless to say that also it is possible to return using, for example, the oscillator unit at the first stage.

As depicted in FIG. 9, the sampler SP (SP1, SP2, SP3, . . . ) may be formed from a circuit including, for example, p-type transistors Tp1 to Tp5 and n-type transistors Tn1 to Tn6. Here, a mirror signal Smr is inputted to the gates of the transistors Tp1, Tn1, Tn2 and Tn6, and a signal d<i> (output signal of the NOR gate NORi1) is inputted to the gate of the transistor Tp2. Further, to the gate of the transistor Tp3, a bias voltage is applied. Further, an output signal n<i> of the sampler SP is outputted from an output of an inverter formed from the transistors Tp5 and Tn5 (an input of an inverter formed from the transistors Tp4 and Tn3).

It is to be noted that also it is possible to return, for example, at one stage before the oscillator unit taking the delay from the clock CLK of the sampler to the output (Q) into consideration. It is to be noted that, for example, in order to further improve the oscillation frequency of the clock CLK, in a process in and after the second cycle in which adjustment of the oscillation frequency of the clock CLK is performed, it is unnecessary to return, for example, at one stage before the oscillator unit. Further, the circuit of the sampler SP depicted in FIG. 9 is a mere example and allows various modifications and alterations, and it is a matter of course that also it is possible to apply an element other than an organic semiconductor, such as a metal oxide semiconductor (MOS) transistor.

The timing chart depicted in FIG. 10 indicates an example in which, for example, the "L" period (tp=9.44 microseconds) of the header part of the command signal Cmd according to ISO 15693 is utilized. In FIG. 10, reference character td indicates a delay by the logic circuit 310 and the NOR gate NORi3. As depicted in FIG. 10, for example, where a ring oscillator is formed such that the oscillator unit at the ith stage is used for return, a clock CLK of one period (cycle time period)≈4×tp may be generated (regenerated). It is to be noted that, in order to generate a clock CLK of a cycle time period≈2×tp, for example, the oscillator unit at the i/2th stage may be used for return to form a ring oscillator. Further, the oscillator at what stage is to be used for return with respect to a detected stage number relies, for example, upon the configuration of the logic circuit 310. For example, the variable clock generation circuit may be modified and altered in various manners.

Figure 11:
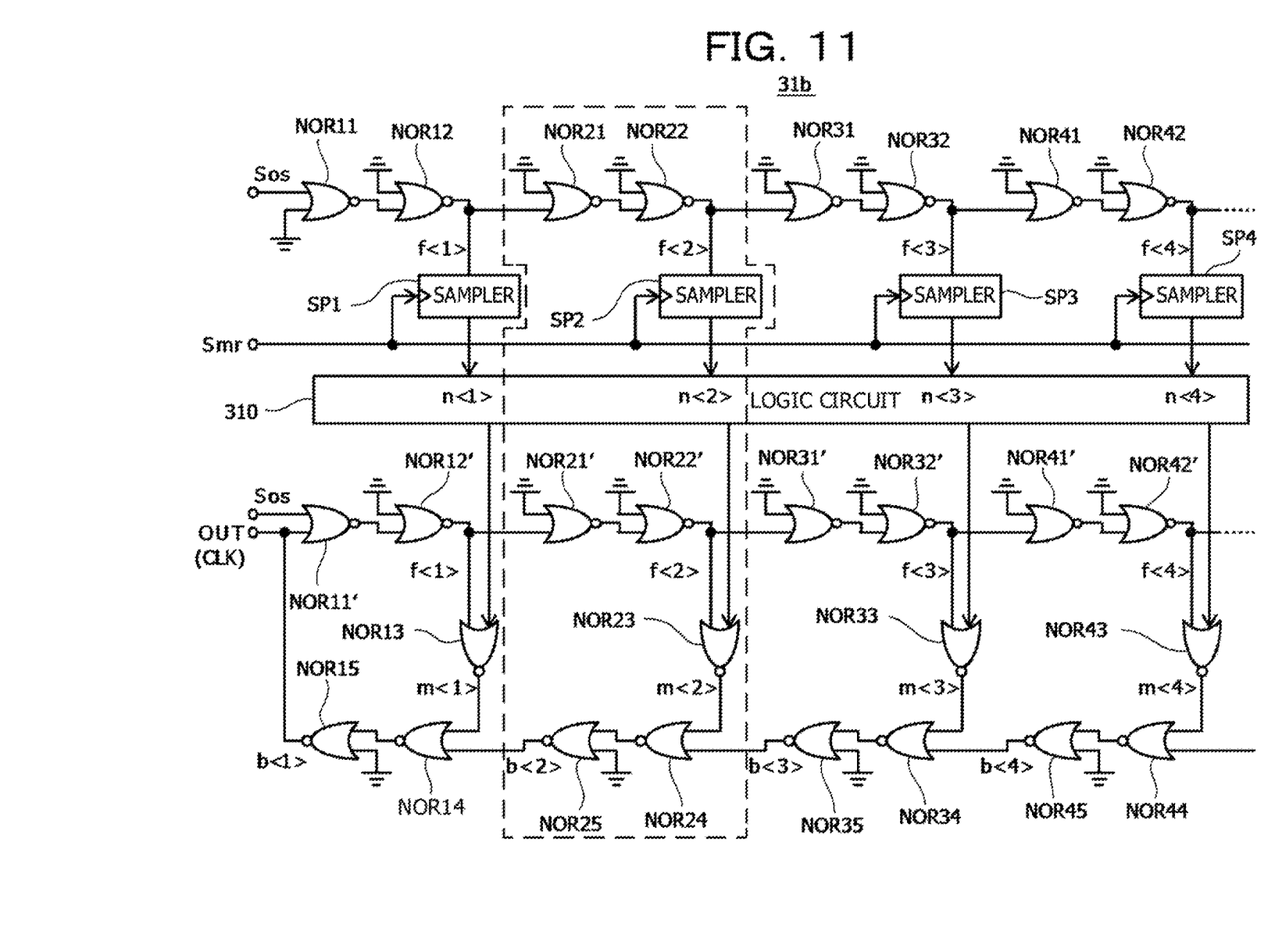
FIG. 11 is a circuit diagram depicting a second example of a variable clock generation circuit in the clock regeneration circuit depicted in FIG. 2.

FIG. 11 is a circuit diagram depicting a second example of a variable clock generation circuit in the clock regeneration circuit depicted in FIG. 2. As may be recognized from comparison between FIG. 11 and FIG. 7 described hereinabove, the variable clock generation circuit 31b of the second example includes NOR gates NOR11', NOR12', NOR21', NOR22', . . . in addition to the variable clock generation circuit 31a of the first example depicted in FIG. 7. Here, the NOR gates NOR11', NOR12', NOR21', NOR22', . . . form an oscillator unit in a ring oscillator, and the NOR gates NOR11, NOR12, NOR21, NOR22, . . . are used to set a return stage number in the oscillator unit.

For example, while, in the variable clock generation circuit 31b of the second example, an oscillation starting signal Sos is inputted to one of the inputs of the NOR gate NOR11 of the oscillator unit at the first stage, the other input is grounded ("L"), and the clock CLK is supplied to one of inputs of the NOR gate NOR11'. For example, in the second example, an output of an inversion logic element at a given stage in one ring oscillator (NOR11', NOR12', NOR13, NOR14, NOR15, . . . ) is selected.

Figure 12:
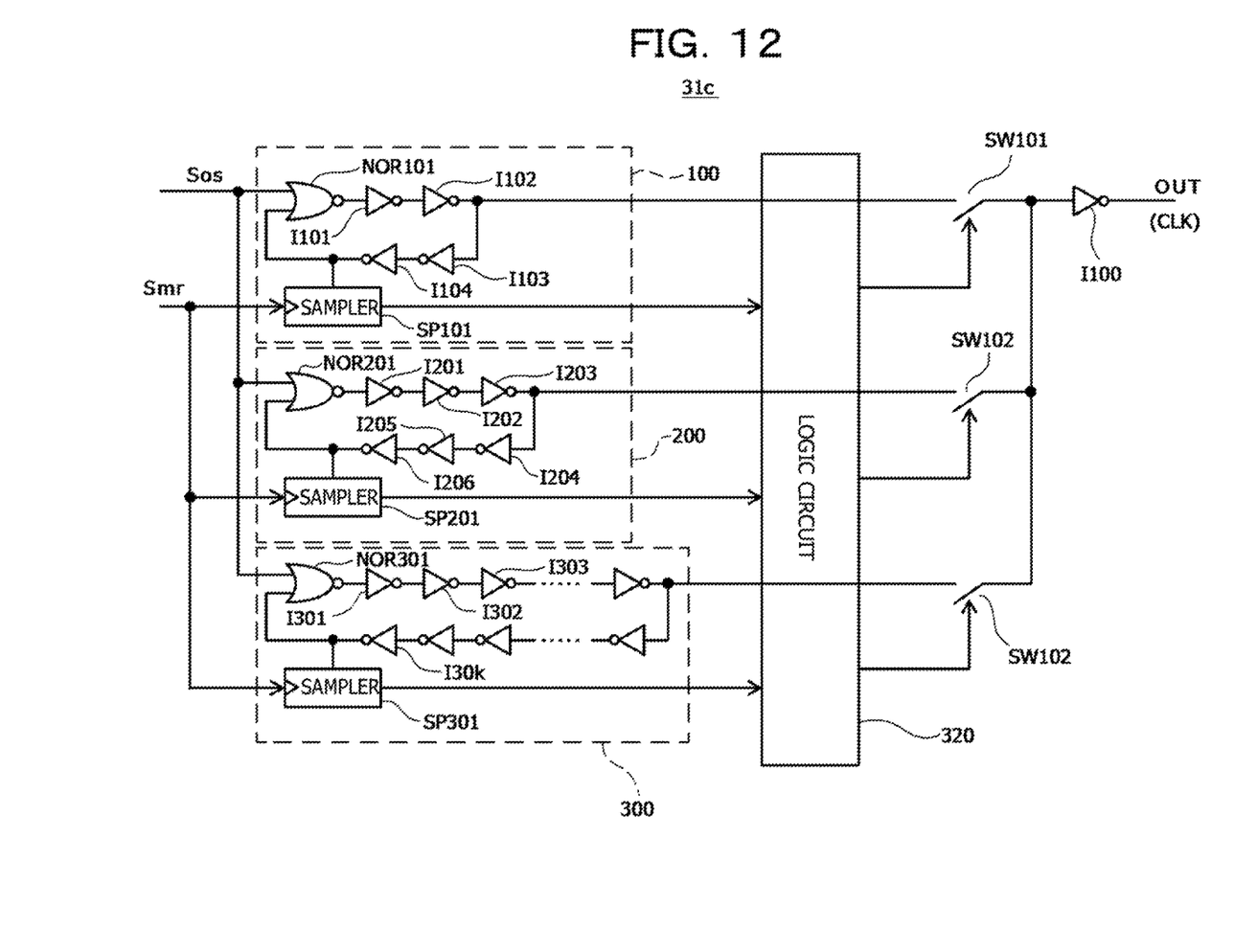
FIG. 12 is a circuit diagram depicting a third example of a variable clock generation circuit in the clock regeneration circuit depicted in FIG. 2.

FIG. 12 is a circuit diagram depicting a third example of a variable clock generation circuit in the clock regeneration circuit depicted in FIG. 2. As depicted in FIG. 12, the variable clock generation circuit 31c of the third example includes a plurality of ring oscillators 100, 200 and 300 of different oscillation frequencies such that an output of a given ring oscillator is selected from among the plurality of ring oscillators. For example, the ring oscillator 100 includes a NOR gate NOR101, inverters I101 to I104 and a sampler SP101, and the ring oscillator 200 includes a NOR gate NOR201, inverters I201 to I206 and a sampler SP201. Further, the ring oscillator 300 includes a NOR gate NOR301, inverters I301 to I30k and a sampler SP301.

Outputs of the ring oscillators 100, 200 and 300 of different oscillation frequencies are inputted to switches SW101, SW102 and SW103, respectively, and one of the outputs is selected based on an output signal of a logic circuit 320 and outputted as a clock CLK through an inverter I100. It is to be noted that, while, in FIG. 12, the three ring oscillators of different oscillation frequencies are depicted, the number of ring oscillators is not limited to three, and also the circuit configuration may be modified and altered in various manners.

As described in detail hereinabove, although the clock regeneration circuit in the present embodiment may be applied, for example, as a tag IC (semiconductor integrated circuit device) and a RF tag in a RFID system described with reference to FIG. 1, naturally the application is not limited to a RFID system. Further, although the present embodiment may be implemented as a clock regeneration circuit for a RFID system even if, for example, an organic semiconductor is applied, it is needless to say that also the transistor to be applied is not limited to an organic semiconductor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A clock regeneration circuit, comprising:
   a pattern detection circuit that detects a pattern having a time interval determined in advance in an input signal; and
   a signal processing circuit that generates a clock by variably controlling a time interval for oscillation based on the time interval of the detected pattern,
   wherein the pattern detection circuit detects a pattern having a time interval determined in advance between a first signal edge at which a signal level of the input signal changes and a second signal edge at which the signal level changes next to the first signal edge.

2. The clock regeneration circuit according to claim 1, wherein the signal level of the input signal changes, at the first edge, from a first level to a second level, and the signal level of the input signal changes, at the second edge, from the second level to the first level or from the first level to the second level.

3. The clock regeneration circuit according to claim 1, wherein
   the signal processing circuit outputs the generated clock, and receives an inputted first command signal and outputs a second command signal obtained by retiming the first command signal based on the clock.

4. The clock regeneration circuit according to claim 1, wherein
   the signal processing circuit includes a variable clock generation circuit that variably controls the time interval for oscillation based on the time interval of the detected pattern and outputs the clock.

5. The clock regeneration circuit according to claim 4, wherein
   the variable clock generation circuit includes one ring oscillator in which a plurality of inversion logic elements each of which inverts an input logic and outputs the inverted logic are coupled in cascade coupling, and a selection circuit that selects an output of one inversion logic element of the plurality of inversion logic elements in the ring oscillator, the inversion logic element having a delay time period corresponding to the time interval of the detected pattern.

6. The clock regeneration circuit according to claim 4, wherein
   the variable clock generation circuit includes a plurality of ring oscillators in each of which a plurality of inversion logic elements each of which inverts an input logic and outputs the inverted logic are coupled in cascade coupling, the ring oscillators being different from each other in the number of inversion logic elements coupled in cascade coupling, and a selection circuit that selects an output of a given ring oscillator from among the plurality of ring oscillators, the given ring oscillator having a delay time period corresponding to the time interval of the detected pattern.

7. The clock regeneration circuit according to claim 4, wherein
   the variable clock generation circuit includes a set of ring oscillators in each of which a plurality of inversion logic elements each of which inverts an input logic and outputs the inverted logic are coupled in cascade coupling, and a selection circuit that selects a return stage number of the set of ring oscillators, a ring oscillator at the return stage number having a period of one half a delay time period corresponding to the time interval of the detected pattern.

8. The clock regeneration circuit according to claim 1, wherein
   the pattern detection circuit starts an operation in response to power-on resetting and stops the action after the pattern having the time interval determined in advance in the input signal is detected.

9. The clock regeneration circuit according to claim 1, wherein
   the clock regeneration circuit is formed from an organic semiconductor.

10. A semiconductor integrated circuit device, comprising:
    a clock regeneration circuit including
    a pattern detection circuit that detects a pattern having a time interval determined in advance in an input signal, and
    a signal processing circuit that generates a clock by variably controlling a time interval for oscillation based on the time interval of the detected pattern; and
    an internal circuit that uses the clock generated by the clock regeneration circuit,
    wherein the pattern detection circuit detects a pattern having a time interval determined in advance between a first signal edge at which a signal level of the input signal changes and a second signal edge at which the signal level changes next to the first signal edge.

11. The semiconductor integrated circuit device according to claim 10, wherein
    the semiconductor integrated circuit device is a tag integrated circuit used in a radio frequency identification system.

12. The semiconductor integrated circuit device according to claim 11, further comprising:
a power generation circuit that receives a signal from a reader-and-writer and generates power.

13. A radio frequency tag, comprising:
a semiconductor integrated circuit device that includes
a pattern detection circuit that detects a pattern having a time interval determined in advance in an input signal, and
a signal processing circuit that generates a clock by variably controlling a time interval for oscillation based on the time interval of the detected pattern, and
an internal circuit that uses the clock generated by the clock regeneration circuit; and
an antenna that transfers a signal to and from a reader-and-writer,
wherein the pattern detection circuit detects a pattern having a time interval determined in advance between a first signal edge at which a signal level of the input signal changes and a second signal edge at which the signal level changes next to the first signal edge.

* * * * *